(12) United States Patent
Kuan et al.

(10) Patent No.: US 11,271,111 B2
(45) Date of Patent: Mar. 8, 2022

(54) SOURCE/DRAIN STRUCTURE WITH BARRIER IN FINFET DEVICE AND METHOD FOR FORMING THE SAME

(71) Applicant: Taiwan Semiconductor Manufacturing Co., Ltd., Hsinchu (TW)

(72) Inventors: Ting-Chun Kuan, Taichung (TW); I-Chih Chen, Tainan (TW); Chih-Mu Huang, Tainan (TW); Fu-Tsun Tsai, Tainan (TW); Sheng-Lin Hsieh, New Taipei (TW); Kuan-Jung Chen, Tainan (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/405,057

(22) Filed: May 7, 2019

(65) Prior Publication Data

US 2020/0035821 A1  Jan. 30, 2020

Related U.S. Application Data

(60) Provisional application No. 62/703,486, filed on Jul. 26, 2018.

(51) Int. Cl.
| | |
|---|---|
| *H01L 29/78* | (2006.01) |
| *H01L 21/8234* | (2006.01) |
| *H01L 21/02* | (2006.01) |
| *H01L 29/66* | (2006.01) |
| *H01L 21/768* | (2006.01) |
| *H01L 27/088* | (2006.01) |

(52) U.S. Cl.
CPC ........ *H01L 29/785* (2013.01); *H01L 21/0214* (2013.01); *H01L 21/76831* (2013.01); *H01L 21/823418* (2013.01); *H01L 21/823431* (2013.01); *H01L 27/0886* (2013.01); *H01L 29/66795* (2013.01)

(58) Field of Classification Search
CPC ................ H01L 21/823418; H01L 21/823431
See application file for complete search history.

(56) References Cited

U.S. PATENT DOCUMENTS

| | | | | |
|---|---|---|---|---|
| 6,071,783 A | * | 6/2000 | Liang ................... | H01L 29/0653 257/E21.431 |
| 8,415,749 B2 | * | 4/2013 | Huang ................ | H01L 29/0653 257/394 |

(Continued)

OTHER PUBLICATIONS

Jambunathan et al., published Jun. 29, 2017, WO 2017/111850 A1.*

(Continued)

*Primary Examiner* — Suberr L Chi
(74) *Attorney, Agent, or Firm* — McClure, Qualey & Rodack, LLP (57) ABSTRACT

A semiconductor device structure is provided. The semiconductor device structure includes a substrate and a gate structure over the substrate. The semiconductor device structure also includes a source/drain feature in the substrate, protruding from the substrate, and on a sidewall surface of the gate structure. The semiconductor device structure also includes an insulating barrier structure in the substrate and partially covering the bottom and sidewalls of the source/drain feature.

20 Claims, 8 Drawing Sheets

(56) References Cited

U.S. PATENT DOCUMENTS

| | | |
|---|---|---|
| 8,796,666 B1 | 8/2014 | Huang et al. |
| 8,815,712 B2 | 8/2014 | Wan et al. |
| 8,963,258 B2 | 2/2015 | Yu et al. |
| 9,093,530 B2 | 7/2015 | Huang et al. |
| 9,171,929 B2 | 10/2015 | Lee et al. |
| 9,214,555 B2 | 12/2015 | Oxland et al. |
| 9,236,267 B2 | 1/2016 | De et al. |
| 9,520,482 B1 | 12/2016 | Chang et al. |
| 9,548,303 B2 | 1/2017 | Lee et al. |
| 9,576,814 B2 | 2/2017 | Wu et al. |
| 10,446,669 B2 * | 10/2019 | Fan ............... H01L 21/3065 |
| 2012/0319120 A1 * | 12/2012 | He ............... H01L 29/66628 257/66 |
| 2018/0308797 A1 * | 10/2018 | Tsai ............... H01L 29/41766 |

OTHER PUBLICATIONS

Screenshot of https://matmatch.com/learn/material/faq-silicon-carbide#link1. (Year: 2021).*

* cited by examiner

SOURCE/DRAIN STRUCTURE WITH BARRIER IN FINFET DEVICE AND METHOD FOR FORMING THE SAME

PRIORITY CLAIM AND CROSS-REFERENCE

This Application claims the benefit of U.S. Provisional Application No. 62/703,486, filed on Jul. 26, 2018, and entitled "SOURCE/DRAIN STRUCTURE WITH BARRIER IN FINFET DEVICE AND METHOD FOR FORMING THE SAME," the entirety of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET). FinFETs are fabricated with a thin vertical "fin" (or fin structure) extending from a substrate. The channel of the FinFET is formed in this vertical fin. A gate is provided over three sides (e.g., wrapping) the fin. Advantages of the FinFET may include reducing the short channel effect and increasing the current flow.

Although existing FinFETs and methods of fabricating FinFETs have been generally adequate for their intended purposes, they have not been entirely satisfactory in all respects. For example, there a challenge to block the source/drain (S/D) leakage in a FinFET device.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows includes embodiments in which the first and second features are formed in direct contact, and may also include embodiments in which additional features may be formed between the first and second features, such that the first and second features may not be in direct contact. The present disclosure may repeat reference numerals and/or letters in some various examples. This repetition is for the purpose of simplicity and clarity and does not in itself dictate a relationship between some various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Embodiments of the disclosure form a semiconductor device structure with FinFETs. The fins may be patterned using any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-alignment process. The sacrificial layer is then removed, and the remaining spacers may then be used to pattern the fins.

Embodiments of methods of forming a semiconductor device structure are provided. The method includes providing a fin structure and a gate structure over the fin structure. Afterwards, the fin structure is recessed to form openings in the fin structure on opposing sidewall surfaces of the gate structure for subsequent source/drain (S/D) features formation. An insulating barrier structure is formed in the openings prior to formation of the source/drain (S/D) features. The formation of the insulating barrier structure includes forming an insulating liner layer to cover inner surfaces of openings. Afterwards, the insulating liner layer is isotropically etched to form residual portions that cover each of bottom corners of each opening. After the source/drain (S/D) features are filled in the openings, those residual portions also cover each of bottom corners of each source/drain (S/D) feature. As a result, the source/drain (S/D) leakage can be effectively blocked by those residual portions, thereby increasing the static on-current to off-current ratio (which is also referred to as an on/off current ratio).

Figure 1A:
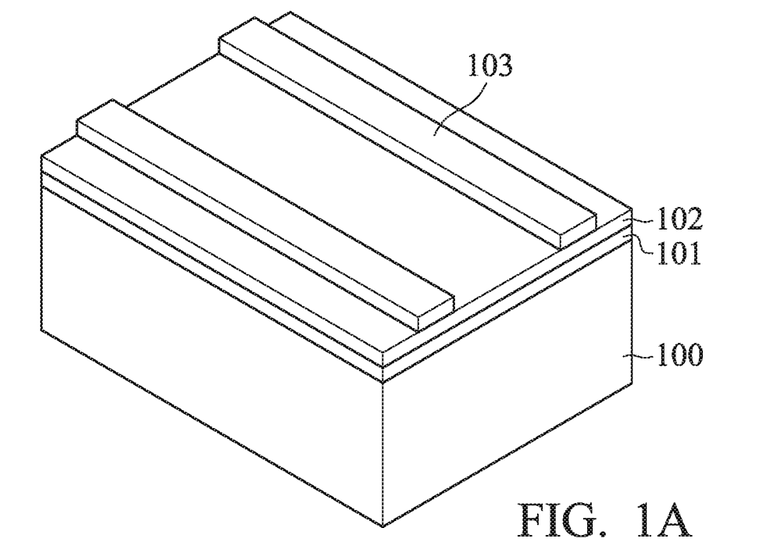
FIGS. 1A to 1G show perspective representations of various stages of forming a FinFET structure, in accordance with some embodiments of the disclosure.

Embodiments of a fin field effect transistor (FinFET) structure and a method for forming a FinFET structure are provided. FIGS. 1A to 1G show perspective representations of various stages of forming a FinFET structure, in accordance with some embodiments of the disclosure. The Fin- FET is used in a input/output (I/O) circuit device and/or a core circuit device in accordance with some embodiments. A substrate 100 is provided, as shown in FIG. 1A in accordance with some embodiments. In some embodiments, the substrate 100 is a semiconductor substrate, such as a bulk semiconductor, a semiconductor-on-insulator (SOI) substrate, or the like, which may be doped (e.g. with a P-type or an N-type dopant) or undoped. In some embodiments, the substrate 100 is a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate.

Other substrates, such as a multi-layered or gradient substrate may also be used. In some embodiments, the semiconductor material of the substrate 100 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. In some embodiments, the substrate 100 includes silicon. In some embodiments, the substrate 100 includes an epitaxial layer. For example, the substrate 100 has an epitaxial layer overlying a bulk semiconductor.

Afterwards, a first masking layer 101 may be formed over the substrate 100 and a second masking layer 102 may be formed over the first masking layer 101, in accordance with some embodiments. In some embodiments, the first masking layer 101 is used as an etch stop layer when the second masking layer 102 is removed or etched. The first masking layer 101 may also be used as an adhesion layer that is formed between the underlying substrate 100 and the overlying second masking layer 102.

In some embodiments, the first masking layer 101 is made of silicon oxide and is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

In some embodiments, the second masking layer 102 is made of silicon oxide, silicon nitride, silicon oxynitride, or another applicable material. In some other embodiments, more than one second masking layer 102 is formed over the first masking layer 101. In some embodiments, the second masking layer 102 is formed by a deposition process, such as a chemical vapor deposition (CVD) process, a low-pressure chemical vapor deposition (LPCVD) process, a plasma enhanced chemical vapor deposition (PECVD) process, a high-density plasma chemical vapor deposition (HDPCVD) process, a spin-on process, or another applicable process.

After formation of the first masking layer 101 and the second masking layer 102, a patterned photoresist layer 103 may be formed over the second masking layer 102 for subsequent definition of one or more fin structures in the substrate 100. In some embodiments, the patterned photoresist layer 103 is formed by a photolithography process. Typically, the photolithography process includes photoresist coating (e.g., spin-on coating), soft baking, mask aligning, exposure, post-exposure baking, developing the photoresist, rinsing and drying (e.g., hard baking).

Figure 1B:
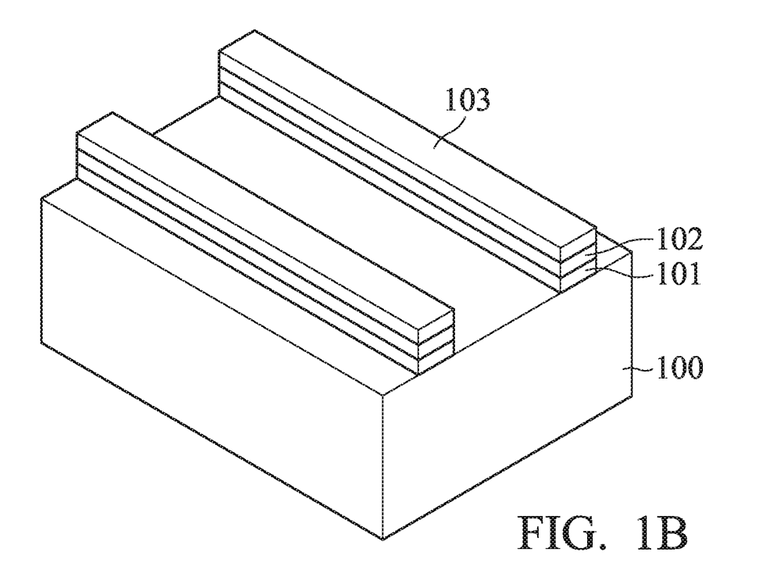

The first masking layer 101 and the overlying second masking layer 102 are patterned by using the patterned photoresist layer 103 as an etch mask, as shown in FIG. 1B in accordance with some embodiments. After the first masking layer 101 and the overlying second masking layer 102 are etched, a patterned first masking layer 101 and a patterned second masking layer 102 are formed, so as to expose portions of the underlying substrate 100, as shown in FIG. 1B.

Figure 1C:
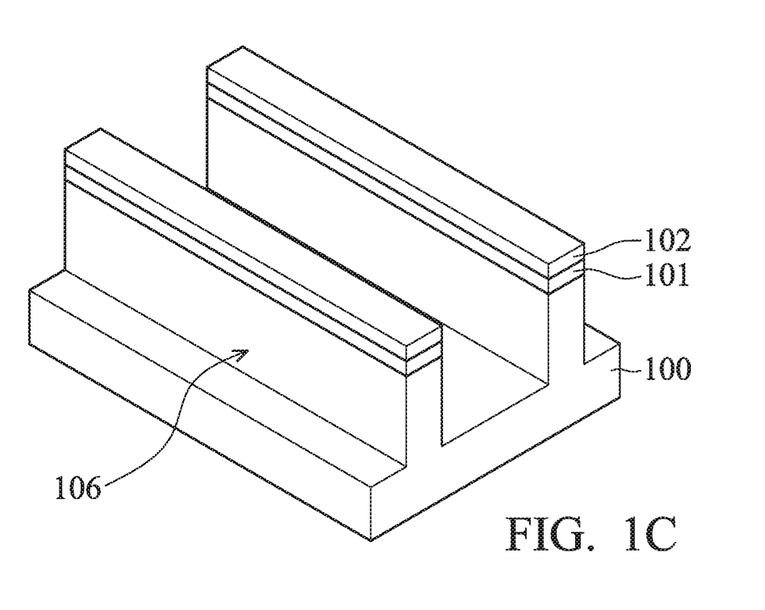

After the portions of the substrate 100 are exposed by forming the patterned first masking layer 101 and the patterned second masking layer 102, the patterned photoresist layer 103 is removed, as shown in FIG. 1C in accordance with some embodiments. Afterwards, the exposed portions of the substrate 100 are partially removed by an etching process using the patterned first masking layer 101 and the patterned second masking layer 102 as an etch mask, so as to form fin structures and trenches in the substrate 100. In order to simplified the diagram, two fin structures 106 protruding from the substrate 100 are depicted as an example.

In some embodiments, the etching process for formation of fin structures 106 is a dry etching process or a wet etching process. In an example, the substrate 100 is etched by a dry etching process, such as a reactive ion etching (RIE), neutral beam etching (NBE), the like, or a combination thereof. The dry etching process may be performed using a process gas including fluorine-based etchant gas. For example, the process gas may include $SF_6$, $C_xF_y$, $NF_3$ or a combination thereof. The etching process may be a time-controlled process, and continue until the fin structures 106 are formed and reach a predetermined height. In some other embodiments, each of the fin structures 106 has a width that gradually increases from the top portion to the lower portion. Namely, each of the fin structures 106 may have tapered sidewalls. A person of ordinary skill in the art will readily understand other methods of forming the fin structures, which are contemplated within the scope of some embodiments.

Figure 1D:
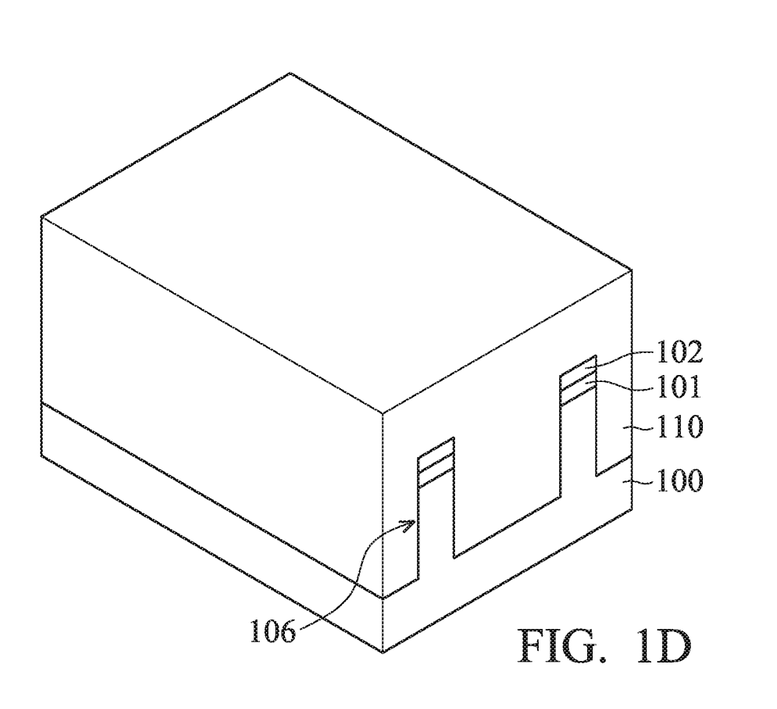

Afterwards, an insulating layer 110 is formed to cover the fin structures 106 over the substrate 100, as shown in FIG. 1D in accordance with some embodiments. In some embodiments, the insulating layer 110 is made of silicon oxide, fluoride-doped silicate glass (FSG), a low-k dielectric material, and/or another suitable dielectric material or another low-k dielectric material. The insulating layer 110 may be deposited by a chemical vapor deposition (CVD) process, a spin-on-glass process, or another applicable process.

In some other embodiments, before the insulating layer 110 is formed, one or more liners (not shown) are formed on the sidewalls of the fin structures 106 and the bottom of the trenches in the substrate 100. In those cases, the liner(s) may be formed of silicon oxide, silicon nitride, silicon oxynitride, silicon carbide (SiC), or a combination thereof. The liner(s) may be deposited by a chemical vapor deposition (CVD) process or another applicable process.

Afterwards, the insulating layer 110 is thinned to expose the top surface of the patterned second masking layer 102, in accordance with some embodiments. For example, the insulating layer 110 is thinned by a chemical mechanical polishing (CMP) process. After the top surface of the patterned second masking layer 102 is exposed, the patterned second masking layer 102 and the patterned first masking layer 101 are removed by one or more etching processes, so as to expose the top surfaces of the fin structures 106. In some embodiments, the patterned second masking layer 102 and the patterned first masking layer 101 are removed by a dry etching process, a wet etching process, or a combination thereof.

Figure 1E:
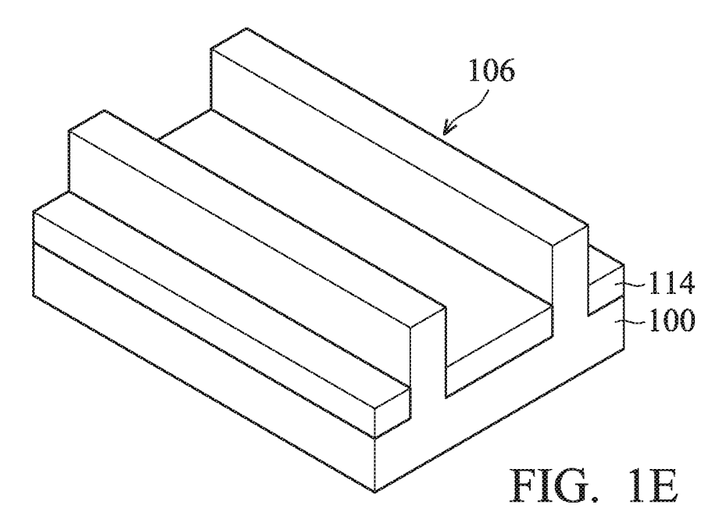

Afterwards, the exposed insulating layer 110 is recessed to form isolation features 114, as shown in FIG. 1E in accordance with some embodiments. In some embodiments, the isolation feature 114 includes the remaining insulating layer 110 and the liner(s) (not shown) surrounding the remaining insulating layer 110. The isolation features 114 may be shallow trench isolation (STI) structures surrounding the fin structures 106, so as to prevent electrical interference or crosstalk. A portion of the fin structure 106 is embedded in the isolation features 114, so that the lower portion of each fin structure 106 is surrounded by the isolation features 114 and the upper portion of each fin structure 106 protrudes from the isolation features 114.

Figure 1F:
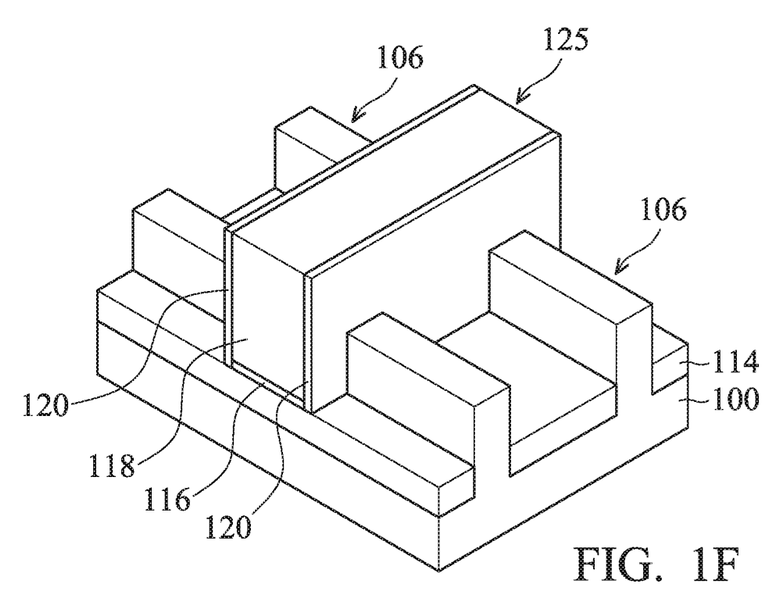

After formation of the isolation features 114, a dummy gate structure 125 is formed across the fin structures 106 and extends over the isolation features 114, as shown in FIG. 1F, in accordance with some embodiments. In some embodiments, the dummy gate structure 125 includes a dummy gate dielectric layer 116 and a dummy gate electrode layer 118 over the dummy gate dielectric layer 116. In some other embodiments, the dummy gate structure 125 includes a dummy cap layer (not shown) formed over the dummy gate electrode layer 118.

The dummy gate dielectric layer 116 is made of a high-k dielectric material such as metal oxide in accordance with some embodiments. Examples of high-k dielectric materials include hafnium oxide ($HfO_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, or other applicable dielectric materials. In some embodiments, the dummy gate dielectric layer 116 may be formed by chemical vapor deposition (CVD), physical vapor deposition, (PVD), atomic layer deposition (ALD), or other applicable processes.

After the dummy gate dielectric layer 116 is formed, the dummy gate electrode layer 118 is formed over dummy gate dielectric layer 116 in accordance with some embodiments. In some embodiments, the dummy gate electrode layer 118 is made of polysilicon. Afterwards, the dummy gate dielectric layer 116 and the dummy gate electrode layer 118 are patterned to form the dummy gate structure 125 over the fin structures 106, in accordance with some embodiments.

Gate spacer layers 120 are formed on opposite sidewall surfaces of the dummy gate structure 125 after the dummy gate structure 125 is formed. The gate spacer layers 120 may be a single layer or multiple layers. In some embodiments, the gate spacer layers 120 are formed of silicon nitride, silicon oxide, silicon carbide, silicon oxynitride, or other applicable materials.

Figure 1G:
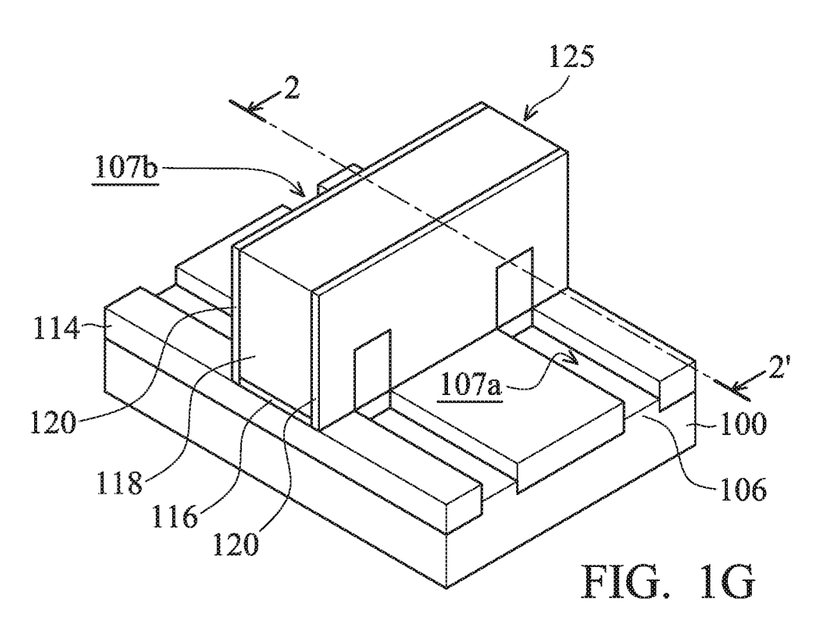

Openings 107a and 107b are formed in each fin structure 106 on opposing sidewall surfaces of the dummy gate structure 125 by a fin recess process (such as a dry etching process or a wet etching process) after the gate spacer layers 120 are formed, as shown in FIG. 1G in accordance with some embodiments. The bottom surfaces of the openings 107a and 107b are lower than the top surfaces of the isolation features 124.

Figure 2A:
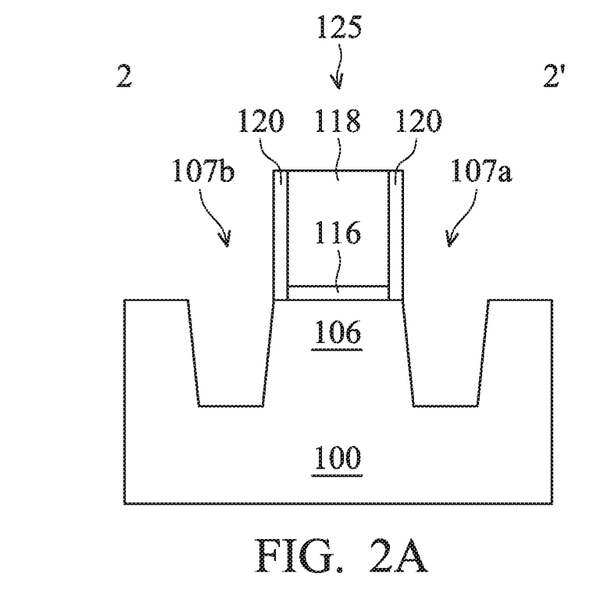
FIGS. 2A to 2G show cross-sectional representations of various stages of forming the FinFET structure after the structure of FIG. 1F, in accordance with some embodiments of the disclosure.

FIGS. 2A to 2G show cross-sectional representations of various stages of forming the FinFET structure after the structure of FIG. 1F, in accordance with some embodiments of the disclosure. FIG. 2A shows a cross-sectional representation taken along line 2-2' of the structure shown in FIG. 1G.

The structure shown in FIG. 1G is provided, as shown in FIG. 2A in accordance with some embodiments. In some embodiments, the structure shown in FIG. 2A includes a substrate 100 having a fin structure 106 protruding from the substrate 100. A dummy gate structure 125 is formed over the fin structure 106. The fin structure 106 includes openings 107a and 107b formed on opposing sidewall surfaces of the dummy gate structure 125.

Figure 2B:
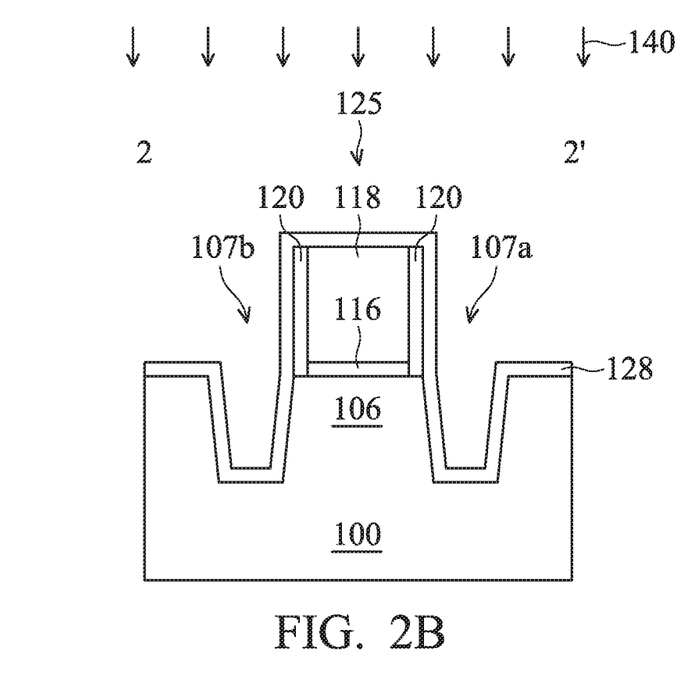

After the openings 107a and 107b are formed, an insulating liner layer 128 is formed over the substrate 100, as shown in FIG. 2B in accordance with some embodiments. The insulating liner layer 128 also conformally formed in the openings 107a and 107b of the substrate 100 and the over the dummy gate structure 125, so as to cover inner surfaces of the openings 107a and 107b and the top surface and the sidewalls of the dummy gate structure 125. In some embodiments, the insulating liner layer 128 has a thickness in a range from about 10 nm to about 20 nm. In some embodiments, the insulating liner layer 128 is made of silicon oxide, silicon nitride, silicon oxynitride, and/or other applicable materials. In some embodiments, the insulating liner layer 128 is formed by plasma enhanced chemical vapor deposition (PECVD), low-pressure chemical vapor deposition (LPCVD), atomic layer deposition (ALD), or other applicable processes.

Afterwards, the insulating liner layer 128 is removed by performing an isotropic etching process 140, as shown in FIG. 2B in accordance with some embodiments. In some embodiments, the isotropic etching process 140 is a wet etching process. In some embodiments, the insulating liner layer 128 is made of silicon oxide and the isotropic etching process 140 is a wet etching process using 500:1 diluted hydrofluoric acid (DHF) as an etching solution.

Figure 2C:
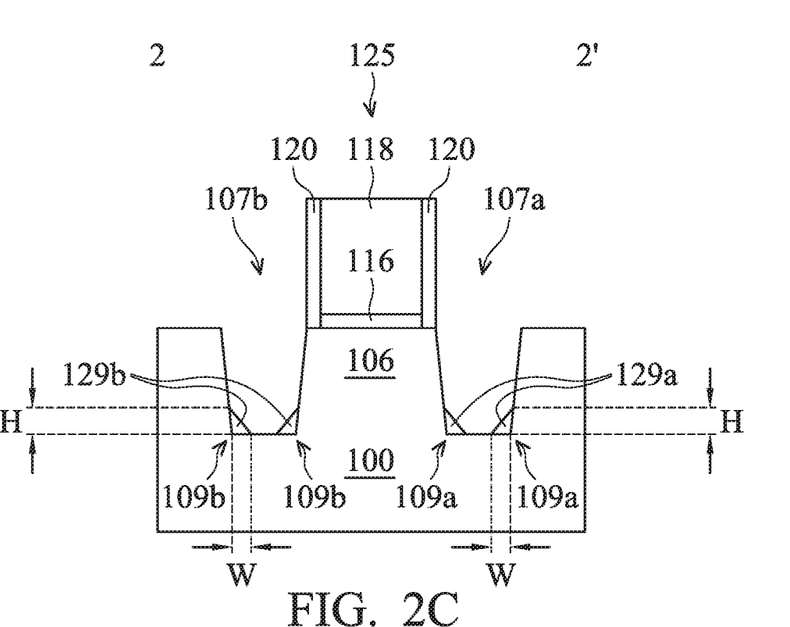

After the insulating liner layer 128 undergoes the isotropic etching process 140, residual portions 129a are formed in the opening 107a and residual portions 129b are formed in the opening 107b, so that the openings 107a and 107b of the fin structure 106 are partially exposed from the remaining insulating liner layer 128 (i.e., the residual portions 129a and 129b), as shown in FIG. 2C in accordance with some embodiments. In some embodiments, the residual portions 129a are located at each of the bottom corners 109a of the opening 107a and spaced apart from each other. Moreover, the residual portions 129b are located at each of the bottom corners 109b of the opening 107b and spaced apart from each other. In some embodiments, those residual portions 129a and 129b are in direct contact with the fin structure 106 of the substrate 100 and form insulating barrier structures in the openings 107a and 107b, respectively, so as to block the source/drain (S/D) leakage. Therefore, each residual portion is also referred to as an insulating barrier portions.

In some embodiments, each of the residual portions 129a and 129b has a height H and a width W. The height H is measured from the bottom of the opening 107a or 107b vertically toward the top of the opening 107a or 107b. The width W is measured from a sidewall of the opening 107a or 107b laterally toward an opposing sidewall of the opening 107a or 107b, as shown in FIG. 2C. In some embodiments, the height H of the residual portion 129a or 129b is in a range from about 5 nm to about 10 nm. Moreover, the width W of the residual portion 129a or 129b is in a range from about 5 nm to about 10 nm. In some embodiments, the residual portion 129a or 129b partially covers the sidewall and the bottom of the opening 107a or 107b to form a tapered sidewall surface, so that there is a decrease in the width W of the residual portion 129a or 129b upward.

The sufficient height and width of the residual portion is designed to serve a barrier structure that effectively blocks source/drain (S/D) leakage while source/drain (S/D) features can be formed smoothly in the subsequent processes.

Figure 2D:
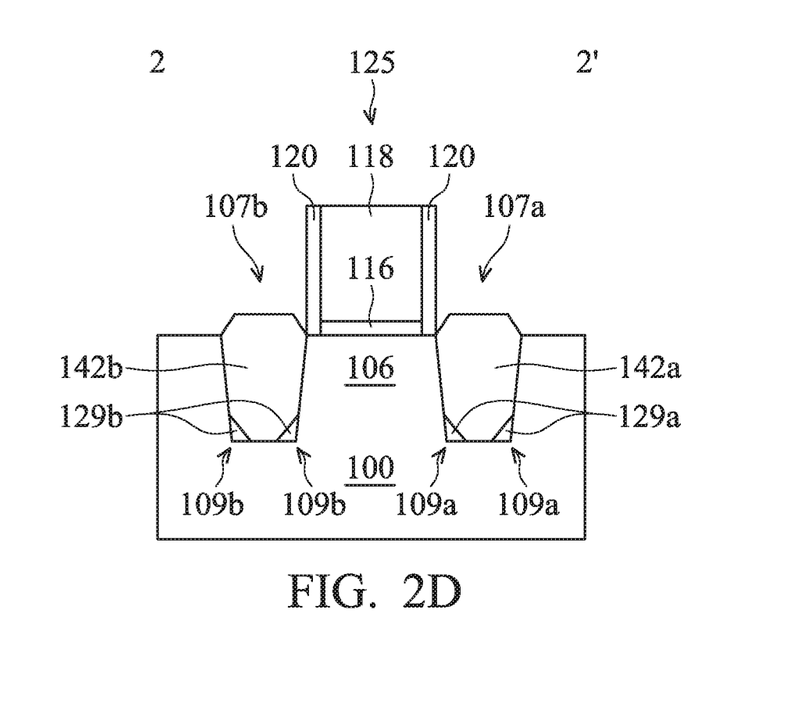

Source/drain (S/D) features 142a and 142b are respectively formed in the openings 107a and 107b of each fin structure 106 and protrude from the openings 107a and 107b, as shown in FIG. 2D in accordance with some embodiments. As a result, the residual portions (or insulating barrier portions) 129a are formed between the source/drain feature 142a and the fin structure 106 and the residual portions (or insulating barrier portions) 129b are formed between the source/drain feature 142b and the fin structure 106. In some embodiments, the bottom corners of the source/drain feature 142a are correspondingly covered by and in direct contact with the residual portions 129a. Moreover, the bottom corners of the source/drain feature 142b are correspondingly covered by and in direct contact with the residual portions 129b.

In some embodiments, a strained material is grown in each of the openings 107a and 107b of the fin structure 106 by an epitaxial process to form the S/D features 142a and 142b. In some embodiments, the lattice constant of the strained material may be different from the lattice constant of the substrate 100. In some embodiments, the S/D structure 106 includes Ge, SiGe, InAs, InGaAs, InSb, GaAs, GaSb, InAlP, InP, or the like.

In some embodiments, before the isotropic etching process 140 is performed, the insulating liner layer 128 is patterned if desired, so that certain S/D features are covered by the insulating barrier structures. For an example, the S/D features used in an I/O circuit device or a core circuit device are covered by the insulating barrier structures. In some embodiments, the insulating liner layer 128 is patterned by lithography and etching processes.

Figure 2E:
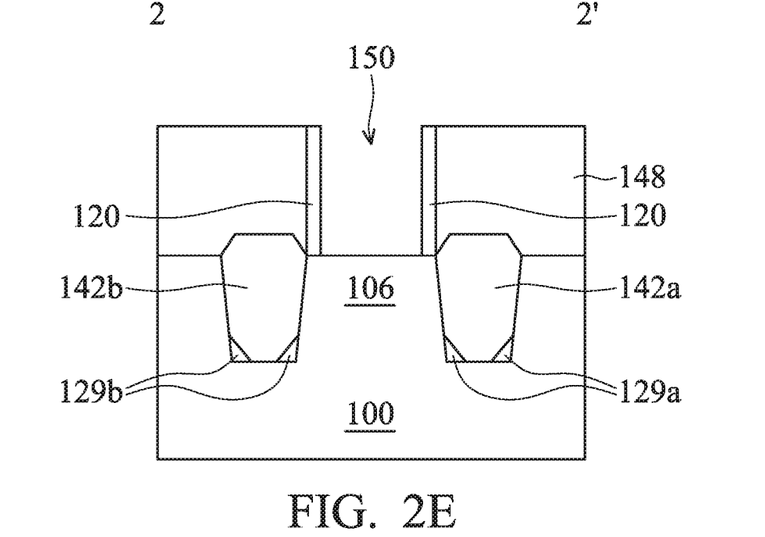

After the S/D features 142a and 142b are formed, an insulating layer 148 (e.g., an inter-layer dielectric (ILD) layer) is formed over the substrate 100 to cover the fin structure 106 and the S/D features 142a and 142b, as shown in FIG. 2E in accordance with some embodiments. In some embodiments, the insulating layer 148 may include multi-layers formed of multiple dielectric materials, such as silicon oxide, silicon nitride, silicon oxynitride, tetraethoxysilane (TEOS), phosphosilicate glass (PSG), borophosphosilicate glass (BPSG), low-k dielectric material, and/or other applicable dielectric materials. Examples of low-k dielectric materials include, but are not limited to, fluorinated silica glass (FSG), carbon doped silicon oxide, amorphous fluorinated carbon, parylene, bis-benzocyclobutenes (BCB), or polyimide. The insulating layer 148 may be formed by chemical vapor deposition (CVD), physical vapor deposition, (PVD), atomic layer deposition (ALD), spin-on coating, or another applicable process.

In some other embodiments, a contact etch stop layer (not shown) is formed over the substrate 100 prior to the formation of the insulating layer 148. In some embodiments, the contact etch stop layer is made of silicon nitride, silicon oxynitride, and/or another applicable material. The contact etch stop layer may be formed by plasma enhanced chemical vapor deposition (PECVD), low-pressure chemical vapor deposition (LPCVD), atomic layer deposition (ALD), or other applicable processes.

After the insulating layer 148 is formed, a planarization process is performed on the insulating layer 148 until the top surface of the dummy gate structure 125 is exposed. In some embodiments, the insulating layer 148 is planarized by a polishing process, such as a chemical mechanical polishing (CMP) process.

Afterwards, the dummy gate structure 125 is removed to form an opening 150 in the insulating layer 148, as shown in FIG. 2E in accordance with some embodiments. The dummy gate dielectric layer 116 and the dummy gate electrode layer 118 are removed by an etching process, such as a dry etching process or a wet etching process. The opening 150 formed in the insulating layer 148 exposes the fin structure 106 between the S/D features 142a and 142b, so that the S/D features 142a and 142b are on opposing sidewall surfaces of the opening 150. Moreover, gate spacer layers 120 are formed on opposite sidewall surfaces of the opening 150.

Figure 2F:
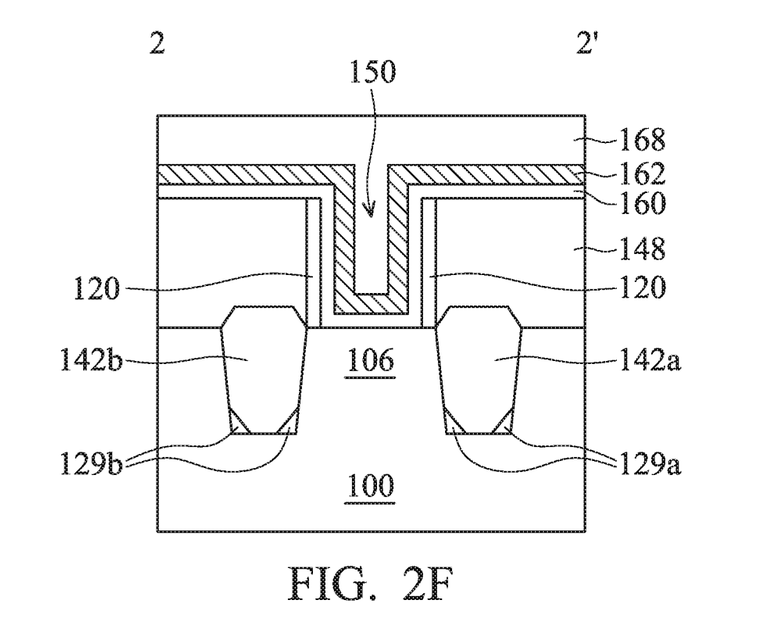

Afterwards, a gate structure is formed in opening 150, in accordance with some embodiments. A gate dielectric layer 160 is conformally formed over the insulating layer 148 and conformally covers the inner surface of the opening 150, as shown in FIG. 2F in accordance with some embodiments. The gate dielectric layer 160 formed in the opening 150 may cover the gate spacer layers 120 and the exposed fin structure 106 between the S/D features 142a and 142b. In some embodiments, the gate dielectric layer 160 is made of a high k dielectric material, such as metal oxide. Examples of the high-k dielectric material may include hafnium oxide (HfO$_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, or other applicable dielectric materials. In some embodiments, the gate dielectric layer 160 may be formed by chemical vapor deposition (CVD), physical vapor deposition, (PVD), atomic layer deposition (ALD), or another applicable process.

An interfacial layer (not shown) may be formed between the exposed fin structure 106 and the gate dielectric layer 160, so that the adhesion of the gate dielectric layer 160 can be improved. In some embodiments, the interfacial layer is made of SiO$_2$. In some embodiments, the interfacial layer is formed by an atomic layer deposition (ALD) process, a thermal oxidation process, chemical vapor deposition (CVD) process, or another applicable process.

After the gate dielectric layer 160 is formed, a work functional metal layer 162 is conformally formed over the insulating layer 148 and conformally covers the inner surface of the opening 150 that is covered by the gate dielectric layer 160, as shown in FIG. 2F in accordance with some embodiments. The work function metal layer 162 is tuned to have a proper work function. In some embodiments, the work function metal layer 162 is made of an N-type work-function metal or a P-type work-function metal. N-type work-function metals include titanium (Ti), aluminum (Al), titanium aluminum alloy (TiAl), titanium aluminum nitride (TiAlN), titanium aluminum carbide (TiAlC), tantalum carbide (TaC), tantalum carbon nitride (TaCN), and combinations thereof. The P-work-function metal includes titanium nitride (TiN), tungsten nitride (WN), tantalum nitride (TaN), or a combination thereof. In some embodiments, the work function metal layer 162 is formed by atomic layer deposition (ALD), sputtering, physical vapor deposition (PVD), or another applicable process.

In some other embodiments, a conformal capping or barrier layer (not shown) is formed over the gate dielectric layer 160 prior to formation of the work function metal layer 162, so that the capping or barrier layer is between gate dielectric layer 160 and the work function metal layer 162. The capping or barrier layer is employed to prevent the metal formed over it from penetrating into the channel region of the fin structure 106 below metal gate structure. In some embodiments, the capping or barrier layer is made of metal nitride. Examples of the metal nitride include TiN, TaN, and WN. The capping or barrier layer may be formed by physical vapor deposition, (PVD), atomic layer deposition (ALD), or another applicable process.

After the work functional metal layer 162 is formed, a metal nucleation layer (not shown) is formed over the insulating layer 148 and in the opening 150 to cover the work functional metal layer 162, in accordance with some embodiments. Afterwards, a metal bulk layer 168 is formed over the metal nucleation layer, as shown in FIG. 2F in accordance with some embodiments.

The metal nucleation layer is formed between the work functional metal layer 162 and the subsequent formed metal bulk layer 168, so that the adhesion of the metal bulk layer 168 can be improved. In some embodiments, the opening 150 is not fully filled with the metal nucleation layer, such that the metal bulk layer 168 fills the opening 150 to serve as a gate electrode layer, as shown in FIG. 2F. In some other embodiments, the opening 150 having the work functional metal layer 162 therein is fully filled by the metal nucleation layer. In those cases, the metal nucleation layer in the opening 150 serve as a gate electrode layer.

In some embodiments, the metal nucleation layer and the overlying metal bulk layer 168 are formed of tungsten (W). In some embodiments, the metal nucleation layer may be formed by physical vapor deposition, (PVD), atomic layer deposition (ALD), or another applicable process. In some embodiments, the metal bulk layer 168 is formed by chemical vapor deposition (CVD), high density plasma CVD (HDPCVD), metal organic CVD (MOCVD), plasma enhanced CVD (PECVD), or another applicable process.

In some other embodiments, a conformal blocking layer (not shown) is formed over the work functional metal layer 162 prior to formation of the metal nucleation layer, so that the blocking layer is between work functional metal layer 162 and the metal nucleation layer. The blocking layer is employed to prevent the byproduct formed during the metal bulk layer 168 deposition from diffusing toward the layers below. In some embodiments, the blocking layer is made of metal nitride. Examples of metal nitride include TiN, TaN, and WN. The blocking layer may be formed by physical vapor deposition, (PVD), atomic layer deposition (ALD), or another applicable process.

Figure 2G:
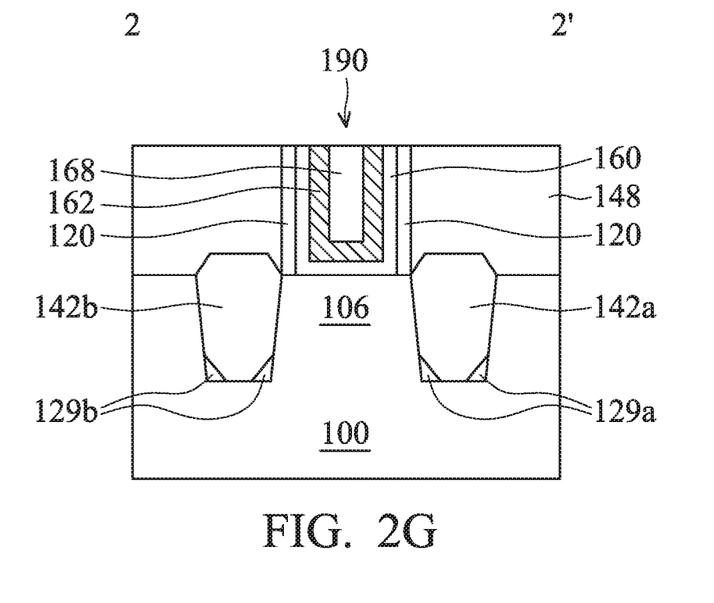

After the metal bulk layer 168 is formed, the metal bulk layer 168, the metal nucleation layer, the work function metal layer 162, and the gate dielectric layer 160 over the insulating layer 148 are successively removed, as shown in FIG. 2G in accordance with some embodiments. For example, the metal bulk layer 168, the metal nucleation layer, the work function metal layer 162, and the gate dielectric layer 160 over the insulating layer 148 are successively removed by a chemical mechanical polishing (CMP) process to expose a top surface of the insulating layer 148. As a result, a gate structure 190 is formed. In some embodiments, the gate structure 190 may at least include the gate dielectric layer 160, the work function metal layer 162, and the gate electrode layer (i.e., the metal nucleation layer or both of the metal nucleation layer and the metal bulk layer 168).

Embodiments of a semiconductor device structure and a method for forming the same are provided. The semiconductor device structure includes a gate structure that is formed over a fin structure substrate. The fin structure is recessed to form openings on opposing sidewall surfaces of the gate structure. Before source/drain (S/D) features are respectively formed in the openings, an insulating barrier structure is formed in the openings to partially cover bottom and sidewalls of each source/drain feature. The formation of the insulating barrier structure includes forming an insulating liner layer to cover inner surfaces of each opening in the fin structure. Afterward, the insulating liner layer is isotropically etched to form insulating barrier portions on the bottoms corners of each opening and spaced apart from each other. The insulating barrier portions can be formed by such a simple process, which is compatible to current process for fabrication of the semiconductor device including FinFETs. After the source/drain (S/D) features fill the openings, the bottom corners of the source/drain (S/D) feature are correspondingly covered by the insulating barrier portions. As a result, the source/drain (S/D) leakage can be effectively blocked by those insulating barrier portions, thereby increasing the static on-current to off-current ratio.

In some embodiments, a semiconductor device structure is provided. The semiconductor device structure includes a substrate and a gate structure over the substrate. The semiconductor device structure also includes a source/drain feature in the substrate, protruding from the substrate, and on a sidewall surface of the gate structure. The semiconductor device structure also includes an insulating barrier structure in the substrate and partially covering a bottom and sidewalls of the source/drain feature.

In some embodiments, a semiconductor device structure is provided. The semiconductor device structure includes a substrate having a fin structure protruding from the substrate. The semiconductor device structure also includes a gate structure formed over the fin structure. The semiconductor device structure also includes a first source/drain feature and a second source/drain feature respectively in the fin structure on opposing sidewall surfaces of the gate structure. The semiconductor device structure also includes first insulating barrier portions formed between the first source/drain feature and the fin structure and second insulating barrier portions formed between the second source/drain feature and the fin structure.

In some embodiments, a method for forming a semiconductor device structure is provided. The method includes forming a gate structure over a fin structure that protrudes from a substrate. The method also includes recessing fin structure to form a first opening and a second opening in the fin structure on opposing sidewall surfaces of the gate structure. The method also includes forming an insulating liner layer to cover inner surfaces of the first and second openings and a top surface and the sidewalls of the gate structure. The method also includes isotropically etching the insulating liner layer to partially expose the fin structure and form first residual portions in the first opening and second residual portions in the second opening. The first residual portions are spaced apart from each other and the second residual portions are spaced apart from each other. The method also includes forming a first source/drain feature and a second source/drain feature respectively in the first and second openings.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
    a substrate;
    a gate structure over the substrate;
    a source/drain feature in the substrate, protruding from the substrate, and on a sidewall surface of the gate structure; and
    an insulating barrier structure in the substrate and partially covering bottom and sidewalls of the source/drain feature, wherein the insulating barrier structure comprises a plurality of portions spaced apart from each other.

2. The semiconductor device structure as claimed in claim 1, wherein the plurality of portions of the insulating barrier structure correspondingly covers a plurality of bottom corners of the source/drain feature.

3. The semiconductor device structure as claimed in claim 1, wherein each of the plurality of portions of the insulating barrier structure is in direct contact with the substrate and the source/drain feature.

4. The semiconductor device structure as claimed in claim 1, wherein a portion of the source/drain feature in the substrate is uncovered by the insulating barrier structure and in direct contact with the substrate.

5. The semiconductor device structure as claimed in claim 1, wherein the source/drain feature is made of an epitaxial material.

6. The semiconductor device structure as claimed in claim 1, wherein the insulating barrier structure is made of oxide, nitride, or oxynitride.

7. The semiconductor device structure as claimed in claim 1, wherein each of the plurality of portions of the insulating barrier structure has a tapered sidewall surface.

8. The semiconductor device structure as claimed in claim 1, wherein the source/drain feature is made of Ge, SiGe, InAs, InGaAs, InSb, GaAs, GaSb, InAlP, or InP.

9. A semiconductor device structure, comprising:
    a substrate having a fin structure protruding from the substrate;
    a gate structure formed over the fin structure;
    a first source/drain feature and a second source/drain feature respectively in the fin structure on opposing sidewall surfaces of the gate structure;
    one of a plurality of first insulating barrier portions formed between the first source/drain feature and the fin structure; and
    one of a plurality of second insulating barrier portions formed between the second source/drain feature and the fin structure.

10. The semiconductor device structure as claimed in claim 9, wherein the plurality of first insulating barrier portions are spaced apart from each other and the plurality of second insulating barrier portions are spaced apart from each other.

11. The semiconductor device structure as claimed in claim 9, wherein a plurality of bottom corners of the first source/drain feature are correspondingly covered by the plurality of first insulating barrier portions, and a plurality of bottom corners of the second source/drain feature are correspondingly covered by the plurality of second insulating barrier portions.

12. The semiconductor device structure as claimed in claim 11, wherein a portion of the first source/drain feature in the fin structure is uncovered by the plurality of first insulating barrier portions and in direct contact with the fin structure, and wherein a portion of the second source/drain feature in the fin structure is uncovered by the plurality of second insulating barrier portions and in direct contact with the fin structure.

13. The semiconductor device structure as claimed in claim 9, wherein the plurality of first insulating barrier portions is in direct contact with the substrate and the first source/drain feature, and wherein the plurality of second insulating barrier portions is in direct contact with the substrate and the second source/drain feature.

14. The semiconductor device structure as claimed in claim 9, wherein the plurality of first insulating barrier portions and the plurality of second insulating barrier portions are formed of oxide, nitride, or oxynitride.

15. The semiconductor device structure as claimed in claim 9, wherein the first and second source/drain features are formed of an epitaxial material.

16. A semiconductor device structure, comprising:
    a fin structure extending from a substrate;
    a gate electrode layer formed over the fin structure;
    a strained source/drain feature formed in the fin structure and adjacent to a sidewall of the gate electrode layer; and
    insulating portions embedded in the fin structure, wherein the insulating portions are correspondingly arranged at bottom corners of the strained source/drain feature, wherein the insulating portions are spaced apart from each other by the strained source/drain feature.

17. The semiconductor device structure as claimed in claim 16, wherein each of the insulating portions is in direct contact with the strained source/drain feature and the fin structure.

18. The semiconductor device structure as claimed in claim 17, wherein each of the insulating portions has a tapered surface that is in direct contact with the strained source/drain feature.

19. The semiconductor device structure as claimed in claim 16, wherein the strained source/drain feature is made of Ge, SiGe, InAs, InGaAs, InSb, GaAs, GaSb, InAlP, or InP.

20. The semiconductor device structure as claimed in claim 16, wherein the insulating portions are made of silicon oxide, silicon nitride, silicon oxynitride.

* * * * *